United States Patent
Das et al.

(10) Patent No.: US 9,424,687 B2
(45) Date of Patent: Aug. 23, 2016

(54) METHOD, APPARATUS AND COMPUTER PROGRAM PRODUCT FOR MODELLING THE NON-LINEAR STRUCTURAL RESPONSE OF A COMPONENT

(71) Applicants: AIRBUS OPERATIONS LIMITED, Bristol (GB); AIRBUS OPERATIONS SAS, Toulouse (FR)

(72) Inventors: Shumit Das, Bristol (GB); Jean Philippe Navarro, Bristol (GB); Martin Kempeneers, Bristol (GB); Vincent Bozon, Bristol (GB)

(73) Assignees: Airbus Operations Limited, Bristol (GB); Airbus Operations (SAS), Toulouse (FR)

( * ) Notice: Subject to any disclaimer, the term of this patent is extended or adjusted under 35 U.S.C. 154(b) by 255 days.

(21) Appl. No.: 14/132,175

(22) Filed: Dec. 18, 2013

(65) Prior Publication Data

US 2014/0168219 A1   Jun. 19, 2014

(30) Foreign Application Priority Data

Dec. 19, 2012  (GB) .................................. 1222883.9

(51) Int. Cl.
*G06T 17/00* (2006.01)
*G06F 17/50* (2006.01)

(52) U.S. Cl.
CPC ............ *G06T 17/00* (2013.01); *G06F 17/5018* (2013.01); *G06F 17/5095* (2013.01)

(58) Field of Classification Search
CPC . G06F 17/5018; G06F 2217/16; G06F 17/13; G06F 17/5004; G06F 2217/10; G06F 2217/12; G06F 17/5009; G06F 17/5095; G06T 17/20; G06T 17/00; B64C 1/12; Y10T 29/49622; Y10T 29/53022
See application file for complete search history.

(56) References Cited

FOREIGN PATENT DOCUMENTS

EP    2 363 819    9/1987

OTHER PUBLICATIONS

Ju, Automation of Modeling and Data Transfer in a Global-Intermediate-Local Analysis Based on ANSYS, published on Jan 22, 2004 at ANSYS Resource Library, downloaded from http://www.ansys.com/staticassets/ANSYS/staticassets/resourcelibrary/confpaper/2004-Int-ANSYS-Conf-19.PDF on Nov. 1, 2015.*
Ransom et al., Global/Local Stress Analysis of Composite Panels, NASA Technical Memorandum 101622, Jun. 1989.*
UK Search Report for GB Application No. 1222883.9, dated Jun. 14, 2013, Jake Collins, 1 page.

* cited by examiner

*Primary Examiner* — Haixia Du
(74) *Attorney, Agent, or Firm* — Nixon & Vanderhye P.C.

(57) ABSTRACT

A method, apparatus and computer program product for modeling the non-linear structural response of a component. The non-linear structural response is modeled using a two-step global-local finite element analysis method, which employs a linear global analysis step, a linear intermediate analysis step and a non-linear local analysis step. The boundary conditions applied in the intermediate step are derived in part from the linear global analysis and the boundary conditions applied in the local analysis are derived in part from the global and intermediate analyses.

12 Claims, 12 Drawing Sheets

METHOD, APPARATUS AND COMPUTER PROGRAM PRODUCT FOR MODELLING THE NON-LINEAR STRUCTURAL RESPONSE OF A COMPONENT

This application claims priority to UK Application No. 1222883.9 filed 19 Dec. 2012, the entire content of which is hereby incorporated by reference.

TECHNICAL FIELD

Embodiments of the invention relate to computational modeling of the non-linear structural response of a component. More particularly, embodiments of the invention relate to computational modeling of the non-linear response of a component subject to one or more out-of-plane effects.

BACKGROUND

Computational techniques for modeling the structural response of complex structures under load have found widespread use in industry and academia. These techniques enable a relatively simple structure or component to be designed such that it performs to specification during its operation or deployment. However, in order to enable modeling of complex 'real-world' structures or components, it is common to make one or more simplifying assumptions regarding the geometry of the structure, the nature of the loading applied to the structure, and/or the material properties of the structure. Unfortunately, assumptions of this nature can cause the computational models to produce spurious results by virtue of failing to capture important 'real-world' structural behaviour. This is particularly disadvantageous in cases where the real-world behaviours have a critical effect on the performance of the structure or component. For example, a real-world structure may fail at lower loads than predicted for the modeled structure, or the failure mode of the real-world structure may not correspond to that determined for the modeled structure. One solution to this problem is to account for the real-world factors by incorporating a safety factor into the structure; however, this can result in components with non-optimum material usage, weight and cost.

One computational technique which has found widespread use is the Finite Element Method (FEM) which is ubiquitous in the field of stress analysis of complex structures. FEM is a numerical technique for finding approximate solutions to partial differential equations (PDEs) in complex systems and involves discretisation of the structure (or 'domain') into a plurality of elements (forming a 'mesh') defined by points in space ('nodes'). One or more boundary conditions which define the behaviour of the structure at its boundaries are applied to the mesh to model applied loads, moments or displacements. In combination, the mesh and its associated boundary conditions form a 'model' which serves as input to the FEM.

The discretisation process for all elements in the domain and the application of the one or more boundary conditions results in matrix equation of finite dimension, the solution of which will approximately solve the original PDEs describing the physical behaviour of the structure under analysis.

In relation to structural analysis, FEM can be broadly categorised as either linear FEM or non-linear FEM. Linear FEM is computationally efficient but does not capture a number of real-world behaviours (e.g. geometric non-linearity, material non-linearity and non-linear boundary conditions). In contrast, non-linear FEM is capable of capturing the various non-linear behaviours of a structure but is often prohibitively expensive from a computational perspective.

For structures which are substantially planar in shape, application of out-of-plane forces can often lead to large displacements and thus a highly non-linear geometric response (e.g. buckling). Generally, such phenomena cannot be captured by linear FEM where large displacements are ignored. However, the solution of non-linear FEM is computationally expensive in comparison to that of linear FEM so it is desirable to develop techniques this alleviate this drawback. One technique which has found widespread use is a 'global-local' approach, whereby linear FEM is used to model the linear response of a global structure (GFEM), and the results of the linear GFEM are applied a local model (representing a part of the global structure) for subsequent non-linear analysis (LFEM). According to this approach, solution of a non-linear problem is required for only the local model, thereby providing a more tractable solution from a computational perspective.

When employing a global-local approach, it is important to define an effective post-processing scheme for extraction of the results of the linear GFEM analysis and transferal of the same to the non-linear LFEM analysis (otherwise known as 'mapping'). Ideally, the chosen mapping scheme should ensure that the results of the non-linear LFEM are as close as possible to those that would be obtained if the non-linear analysis was performed on the GFEM, and to those of the real-world behavior of the structure being analyzed.

SUMMARY

In accordance with a first aspect of the present invention, there is provided a computer-implemented method of modeling the non-linear structural response of a component, the method comprising the steps of: determining one or more intermediate boundary conditions for application to an intermediate mesh, the one or more intermediate boundary conditions being determined on the basis of a linear finite element analysis of a global mesh subject to one or more global boundary conditions; performing a linear finite element analysis of the intermediate mesh subject to the one or more intermediate boundary conditions; determining one or more local boundary conditions for application to a local mesh, the one or more local boundary conditions being determined on the basis of the linear finite element analysis of the intermediate mesh; and performing a non-linear finite element analysis of the local mesh subject to the one or more local boundary conditions; wherein the global mesh is associated with a global domain representing a structure comprising the component, the intermediate mesh is associated with an intermediate domain which is a sub-domain of the global domain, and the local mesh is associated with a local domain which is a sub-domain of the intermediate domain.

According to an embodiment of the computer-implemented method, the one or more local boundary conditions comprise an out-of-plane load.

According to an embodiment of the computer-implemented method, the out-of-plane load comprises an out-of-plane pressure load applied to one or more nodes in the local mesh corresponding to a surface of the component.

According to an embodiment of the computer-implemented method, the one or more local boundary conditions comprise an imposed displacement to one or more nodes at the boundary of the local mesh.

According to an embodiment of the computer-implemented method, the global domain represents an aircraft wing box comprising the component.

According to an embodiment of the computer-implemented method, the one or more intermediate boundary conditions are applied to one or more nodes at the boundary of the intermediate mesh as nodal reaction forces derived from one or more free body loads obtained from the linear finite element analysis of the global mesh.

According to an embodiment of the computer-implemented method, the mesh density of the global mesh is relatively coarse and the mesh density of the intermediate mesh is relatively fine.

According to an embodiment of the computer-implemented method, the mesh density of the local mesh is equal to the mesh density of the intermediate mesh.

According to an embodiment of the computer-implemented method, the one or more intermediate boundary conditions are determined using a mesh sewing technique to map displacements obtained from linear finite element analysis of the global mesh to the intermediate mesh.

According to an embodiment of the computer-implemented method, the mesh sewing technique assumes a linear displacement field between adjacent nodes in the global mesh.

According to an embodiment of the computer-implemented method, the local mesh is derived from the intermediate mesh by supressing one or more elements in the intermediate mesh.

According to an embodiment of the computer-implemented method, the component is a stiffened panel.

In accordance with a second aspect of the present invention, there is provided a system for modeling the non-linear structural response of a component, the system comprising a processor arranged to: determine one or more intermediate boundary conditions for application to an intermediate mesh, the intermediate boundary conditions being determined on the basis of a linear finite element analysis of a global mesh subject to one or more global boundary conditions; perform a linear finite element analysis of the intermediate mesh subject to the one or more intermediate boundary conditions; determine one or more local boundary conditions for application to a local mesh, the local boundary conditions being determined on the basis of the linear finite element analysis of the intermediate mesh; and perform a non-linear finite element analysis of the local mesh subject to the one or more local boundary conditions; wherein the global mesh is associated with a global domain representing a structure comprising the component, the intermediate mesh is associated with an intermediate domain which is a sub-domain of the global domain, and the local mesh is associated with a local domain which is a sub-domain of the intermediate domain.

In accordance with a third aspect of the present invention, there is provided a computer program product comprising a non-transitory computer-readable storage medium having computer readable instructions stored thereon, the computer readable instructions being executable by a computerized device to cause the computerized device to perform a method of modeling the non-linear structural response of a component, the method comprising: determining one or more intermediate boundary conditions for application to an intermediate mesh, the intermediate boundary conditions being determined on the basis of a linear finite element analysis of a global mesh subject to one or more global boundary conditions; performing a linear finite element analysis of the intermediate mesh subject to the one or more intermediate boundary conditions; determining one or more local boundary conditions for application to a local mesh, the local boundary conditions being determined on the basis of the linear finite element analysis of the intermediate mesh; and performing a non-linear finite element analysis of the local mesh subject to the one or more local boundary conditions; wherein the global mesh is associated with a global domain representing a structure comprising the component, the intermediate mesh is associated with an intermediate domain which is a sub-domain of the global domain, and the local mesh is associated with a local domain which is a sub-domain of the intermediate domain.

BRIEF DESCRIPTION OF THE DRAWINGS

Further features and advantages of the invention will become apparent from the following description of preferred embodiments of the invention, given by way of example only, which is made with reference to the accompanying drawings, in which.

DETAILED DESCRIPTION

Mapping from the results of a linear GFEM to a non-linear LFEM in a global-local approach can often induce a spurious structural stiffness in the non-linear LFEM due to kinematic constraints imposed by the mapping of nodal forces from the global mesh to the local mesh. This spurious stiffness inhibits the ability of the non-linear LFEM to accurately model the effect of out-of-plane loading in the structure under analysis and is thus undesirable. Accordingly, embodiments of the invention seek to provide mapping techniques which minimise or eliminate this spurious stiffness by employing a two-step global-local approach which includes an additional 'intermediate' model to improve modeling results at the local level (otherwise termed a 'two-step local approach').

Figure 1:
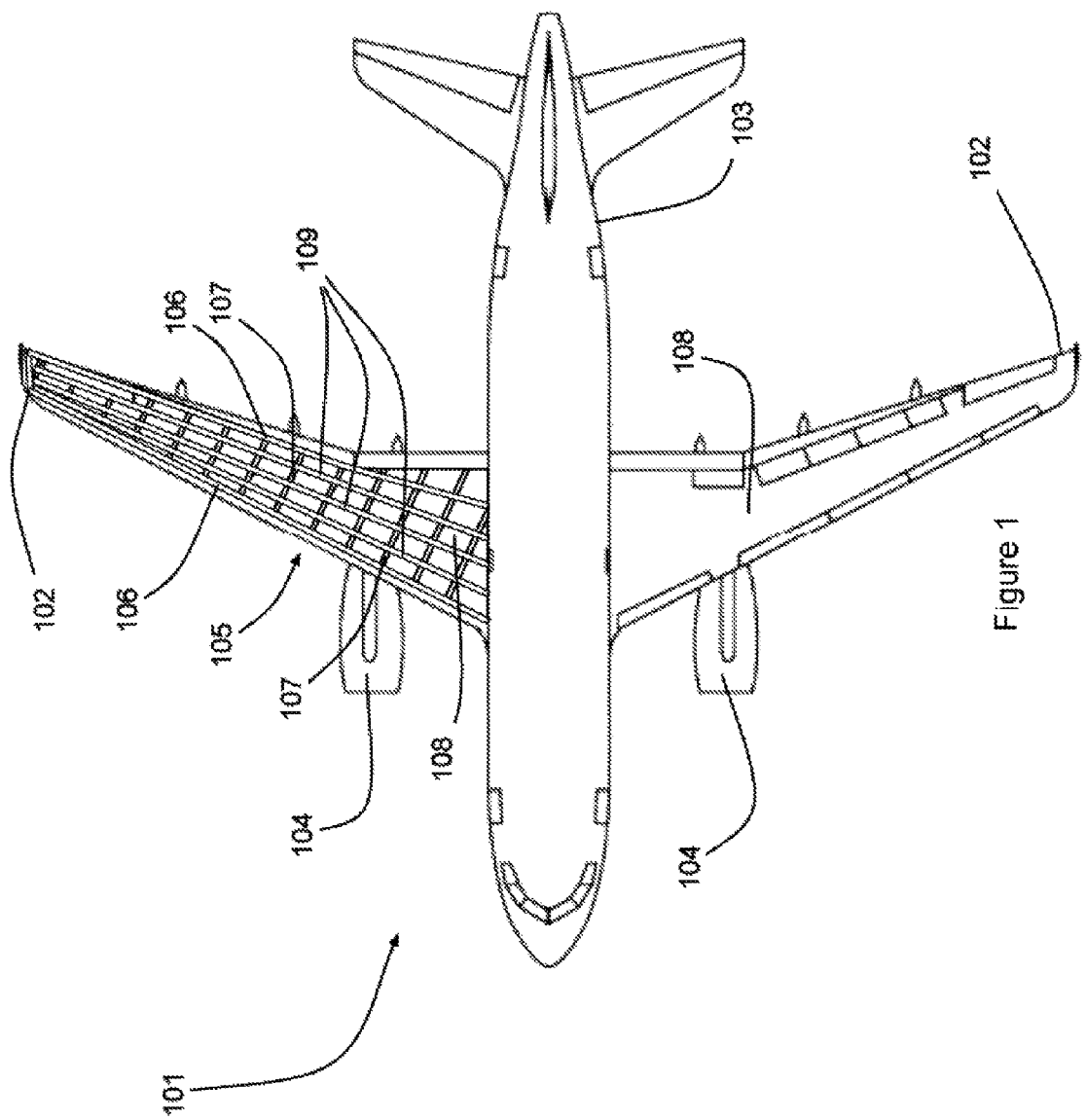
FIG. 1 is a schematic drawing of an aircraft comprising a wing box in accordance with an embodiment.

Embodiments of the two-step local approach are described with reference to FIG. 1 which shows a simplified view of an aircraft 101. The aircraft 101 comprises a pair of wings 102 each fared into a fuselage 103 and each carrying an engine 104. Each wing 102 has a wing box 105 at its core that provides the main structure of the wing 102 and provides the attachment point of the wing 102 to the fuselage 103. The engines 104 and the remaining wing elements such as the leading and trailing edge structures are all attached to the wing box 105. Each wing box 105 comprises a set of spars 106, ribs 107, wing covers 108 and stringers 109. The ribs 107 are arranged generally parallel and spaced apart along the span of the wing box 105. The spars 106 run span-wise from the root to the tip of the wing box 105 converging towards its tip. The wing covers 108 are attached over the spars 106 and ribs 107 to provide the aerofoil surface of the wing box 105. The stringers 109 are attached to the inner surface of the wing covers 108 and provide stiffening thereto.

Figure 2:
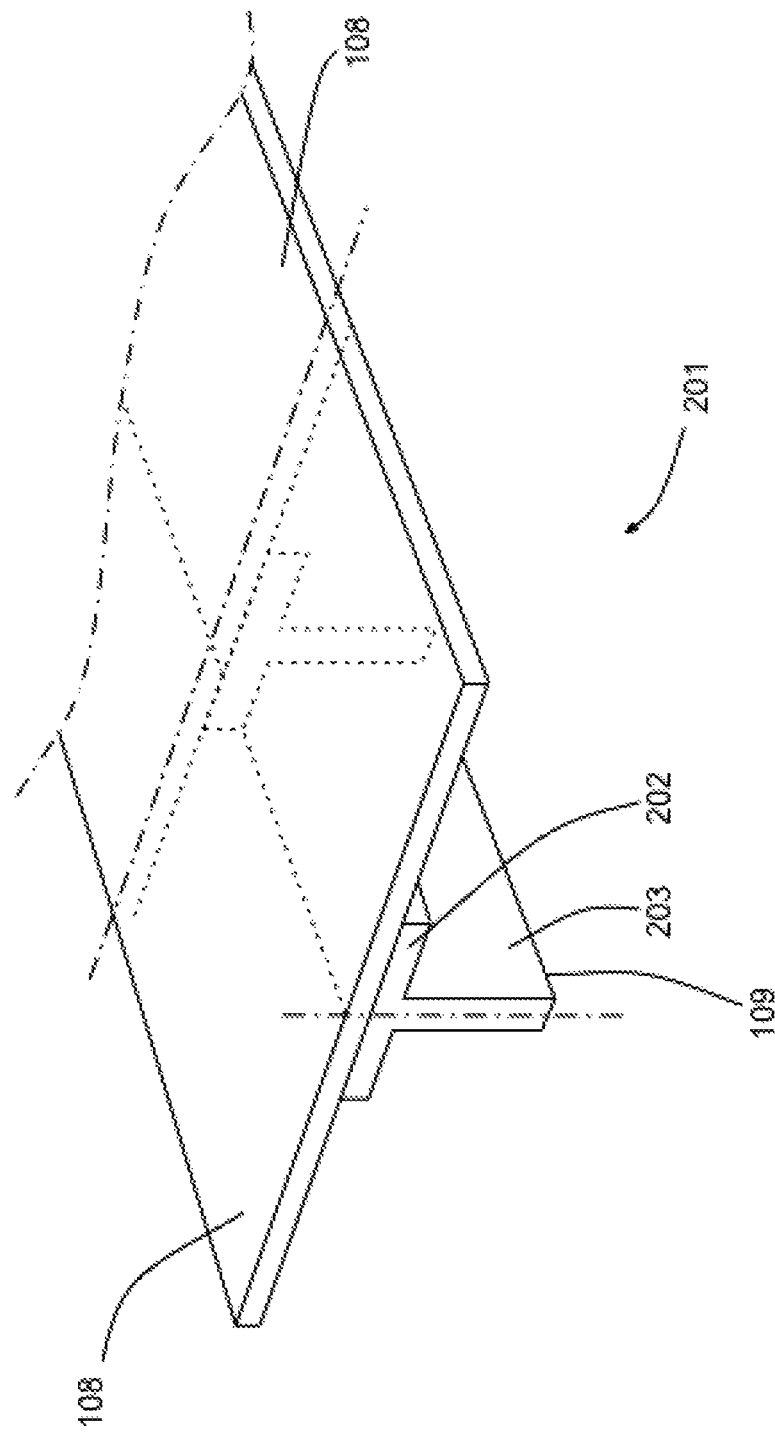
FIG. 2 is a schematic drawing of a super stringer model in accordance with an embodiment.

FIG. 2 shows a section of the aircraft wing box 105 known as a super-stringer 201. The super-stringer 201 comprises a portion of a stringer 109 and two adjacent wing covers 108 that span two or more adjacent ribs (not shown in FIG. 2). In other words, the super stringer 201 is a section taken from the wing box 105 that extends chord-wise by one wing cover 108 either side of a particular stringer 109, and extends span-wise between two or more adjacent ribs 107. In the super-stringer 201 shown in FIG. 2, the stringer is "T" shaped, comprising a foot 202, fixed to the underside of the joint between the two wing covers 108, and a centrally positioned blade 203 which is perpendicular to the foot 202.

Figure 3A:
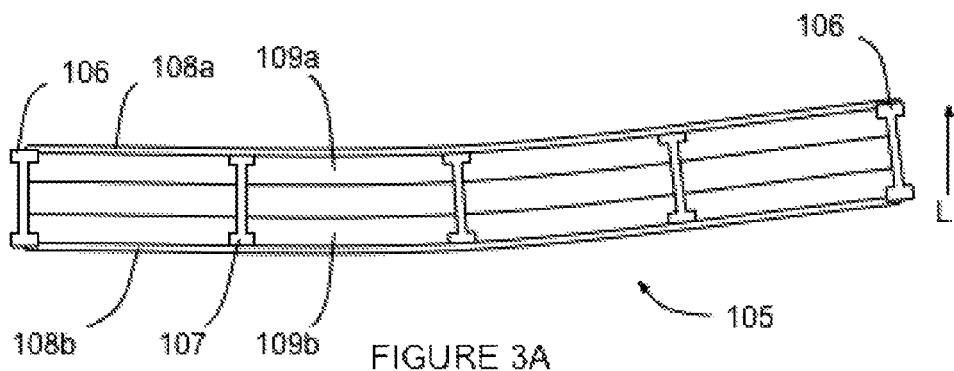
FIGS. 3A to 3C are schematic drawings of a span-wise cross-section of a wing box subject to selected loading regimes in accordance with an embodiment.

FIG. 3A shows a span-wise cross-section of the wing box 105 under a load represented by the arrow L. As can be seen from FIG. 3A, as the wing box 105 deflects in response to the load L, the upper wing cover 108a is subjected to compressive load while the lower wing cover 108b is subjected to a tensile load. In this example, the shapes of each component are assumed from their design specification and their behaviour in response to the loading L can thus be modeled on that basis in the design process. However, in use, the wing-box 105 is likely to be subject to a number of out-of-plane effects or loadings that result in the deformation of one or more of its components from their designed shape. As a result of this deformation, caused by the out-of-plane effects, the performance of wing box 105 under load may change. For example, the strain induced in the wing box 105 as a result of a load L case may exceed the allowable strain for that component and, if ignored, may result in the unsafe operation or failure of that component.

Figure 3B:
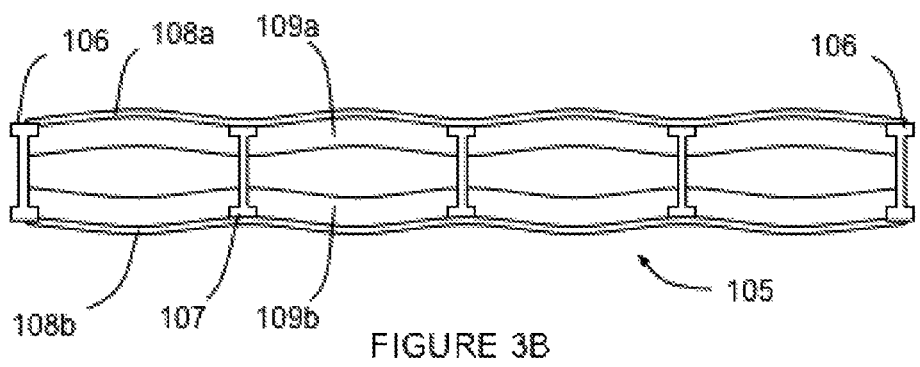
Figure 3C:
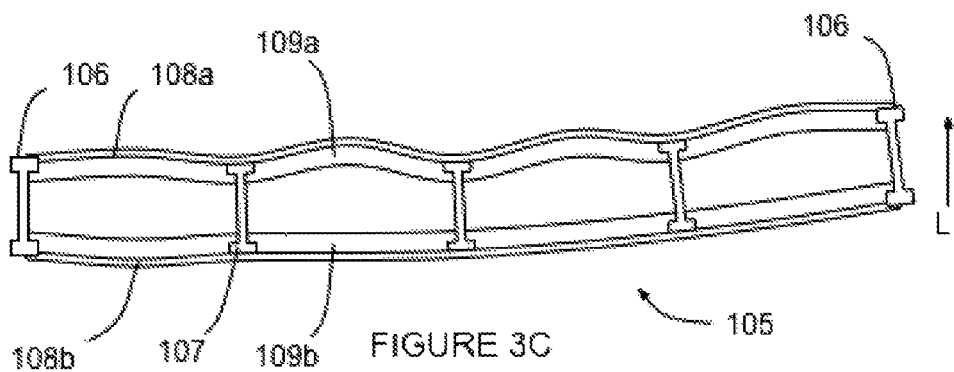

FIG. 3B shows the wing box 105 without load L but subjected to an out-of-plane load in the form of internal positive pressure (e.g. resulting from being loaded with fuel). The effect of the fuel pressure is to effectively inflate the wing box 105, resulting in an outward bulging of the upper and lower wing covers 108a, 108b. With reference to FIG. 3C, the result of the out-of-plane pressure load alters the performance of the wing box 105 when subjected to the load L. For example, the upper wing cover 108a is predisposed to bulging further upward and may thus be less capable of safely bearing the strains induced by the load L. Similarly, the lower wing cover 108b may need to be stretched relatively flat before it can provide its designed support for the upward load L. Thus, it will be appreciated that the geometric response of the combined pressure force and force L is highly non-linear and cannot typically be captured using linear FEM techniques.

Figure 4A:
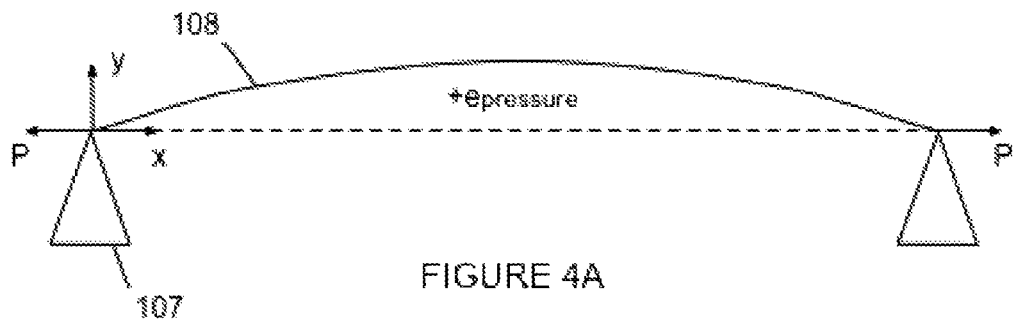
FIGS. 4A to 4C are schematic drawing of a wing box showing the influence of selected out-of-plane effects in accordance with an embodiment.
Figure 4B:
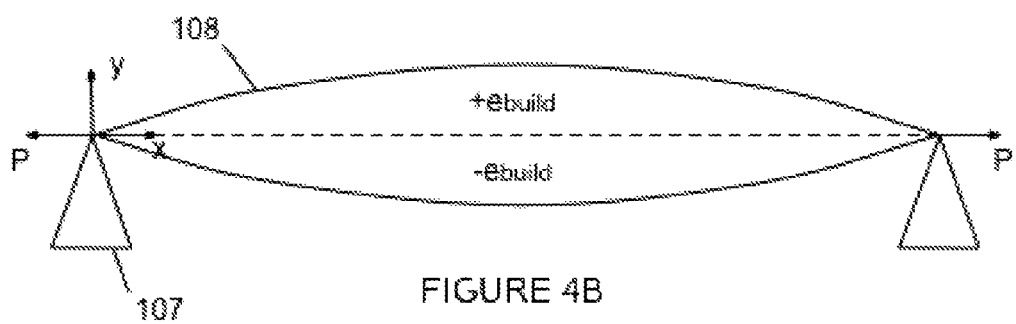
Figure 4C:
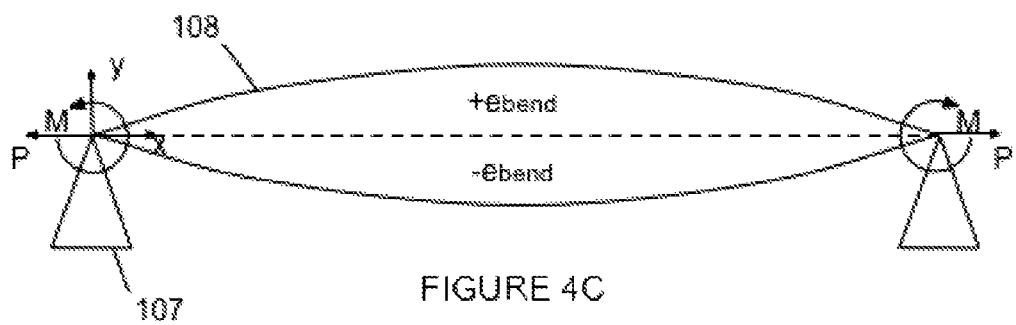

In addition to the pressure out-of-plane effect, illustrated with reference to FIGS. 3A-C, out-of-plane effects may be caused by build tolerances (a 'build out-of-plane effect') and bending (a 'bending out-of-plane effect'). With reference to FIG. 4A, the pressure out-of-plane effect is the result of positive internal pressure in the wing box 105 that causes the wing covers 108 to bulge outwardly. This causes a positive eccentricity, $e_{pressure}$, in the wing cover panel 108. With reference to FIG. 4B, the build out-of-plane effect is the result of manufacturing tolerances which cause a positive or negative eccentricity $\pm e_{build}$ in the wing cover panel 108. With reference to FIG. 4C, the bending out-of-plane effect is the result of the overall bending of the wing box 105 which results in a positive or negative eccentricity $\pm e_{bend}$ in the wing cover panel 108. Each of the applied out-of-plane effect eccentricities causes a curvature in the wing cover 108 which will then affect the final elastic lateral deflection of the overall wing box 105. It is important to account for these eccentricities when modeling aircraft components using FEM to ensure that the results of the FEM are as close to the real-world behaviour of the component as possible.

Figure 5:
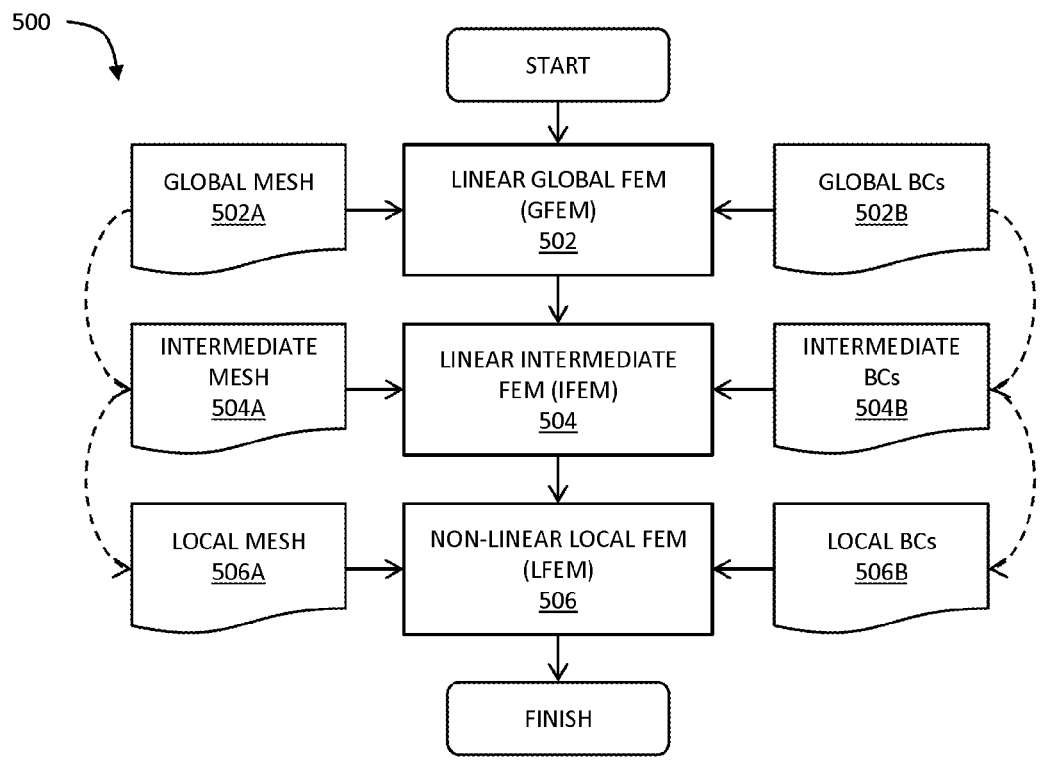
FIG. 5 is a flow diagram showing a method of modeling the non-linear structural response of a component in accordance with an embodiment.

FIG. 5 shows an overview of a two-step local computational modeling method 500 in accordance with an embodiment. The method comprises three stages: (i) a linear global FEM analysis 502 (hereinafter termed 'linear GFEM'); (ii) a linear intermediate FEM analysis 504 (hereinafter termed 'linear IFEM'); and (iii) a non-linear local FEM analysis 506 (hereinafter termed 'non-linear LFEM').

The linear GFEM analysis 502 takes as input a global mesh 502A and a set of global boundary conditions 502B. Typically, the global mesh 502A is based on a global domain (or geometry) that includes the component of interest and the global boundary conditions typically represent the loads and/or displacements which are applied to one or more nodes in the global mesh 502A. Together, the global mesh 502A and the global boundary conditions 502B form a global model on which the linear GFEM analysis is performed.

The linear IFEM analysis 504 takes as input an intermediate mesh 504A and a set of intermediate boundary conditions 504B. Typically, the intermediate mesh 504A is based on an intermediate domain (or geometry) which includes part or whole of the component of interest and is a sub-domain of the global domain. The intermediate boundary conditions 504B typically represent the forces and/or displacements which are applied to one or more nodes in the intermediate mesh 504A and are obtained from a post processing of the linear GFEM analysis (discussed below in more detail). Together, the intermediate mesh 504A and the intermediate boundary conditions 504B form an intermediate model on which the IFEM analysis is performed.

The non-linear LFEM analysis 506 takes as input a local mesh 506A and a set of local boundary conditions 506B. Typically, the local mesh 506A is based on a local domain (or geometry) which includes part or whole of the component of interest and is a sub-domain of the intermediate domain. The local boundary conditions 506B typically represent the forces and/or displacements which are applied to one or more nodes in the local mesh 506A and are obtained from a post processing of the linear IFEM analysis and include one or more imposed out-of-plane loadings, as discussed below in more detail. Together, the local mesh 506A and the local boundary conditions 506A form a local model in which the non-linear FEM analysis is performed.

From FIG. 5, it will be apparent that there is a hierarchical relationship between the global domain, the intermediate domain and the local domain employed in the GFEM 502, IFEM 504 and LFEM 506 respectively. Indeed, from a geometrical perspective, the local domain may be considered to be a sub-domain of the intermediate domain, and in turn the intermediate domain may be considered to be a sub-domain of the global domain. Similar considerations apply to the boundary conditions, wherein the local boundary 506B are derived from the results of the IFEM analysis 504 and the intermediate boundary conditions 504B are derived from the results of the GFEM analysis 502. However, significantly, it will be noted that the out-of-plane loading is applied as a boundary condition to the linear GFEM and non-linear LFEM but is not present in the linear IFEM. These relationships are explained in further detail below.

Figure 6:
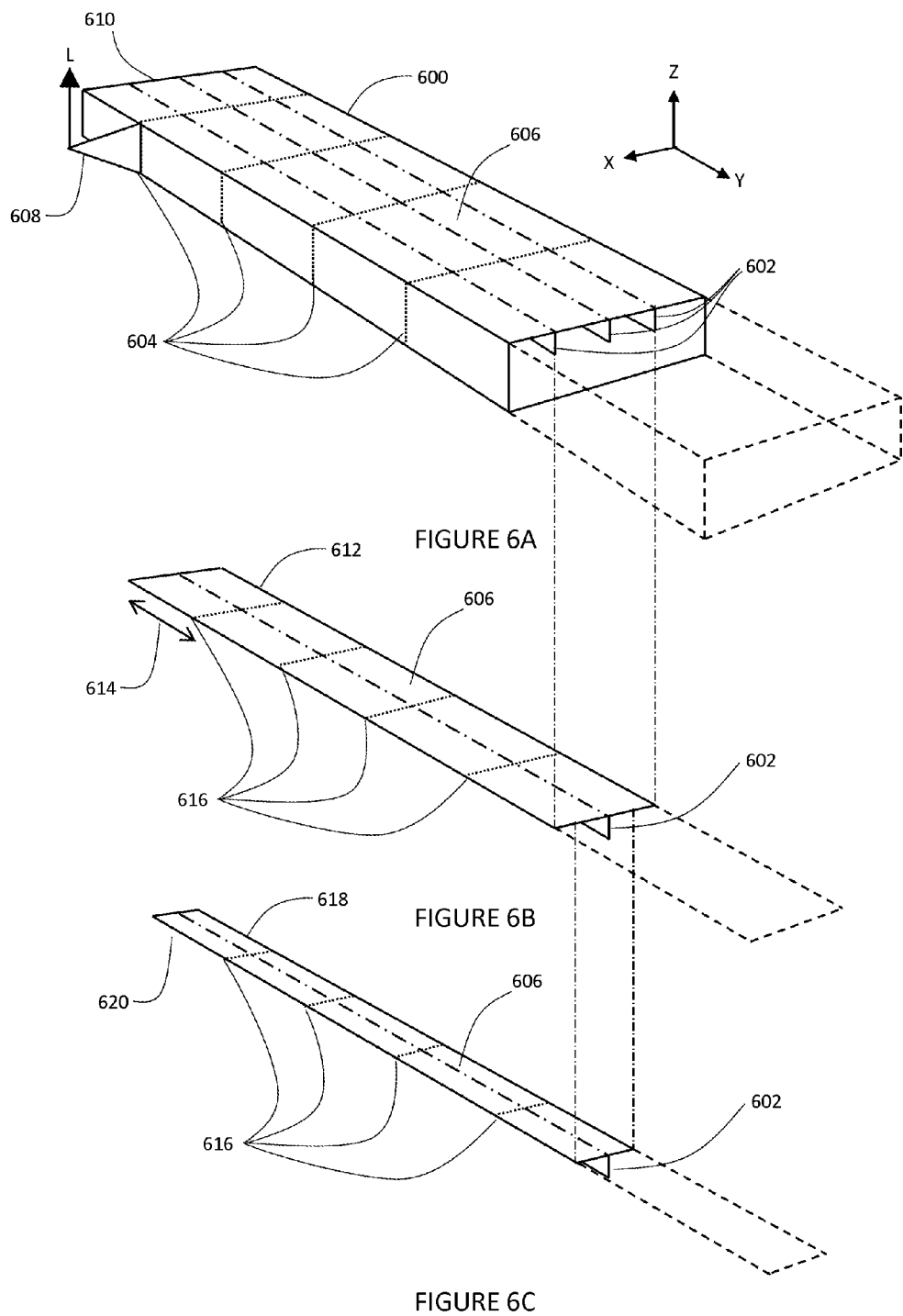
FIGS. 6A to 6C are schematic diagrams of a global domain, an intermediate domain and a local domain respectively in accordance with an embodiment.

Embodiments of the two-step local approach as applied to an idealised wing box to determine the non-linear structural behaviour of a super-stringer when subject to an out-of-plane pressure loading will now be described. For this purpose, FIGS. 6A-C respectively show a global model 600 corresponding to the idealized wing box (for use in the linear GFEM), an intermediate model 612 corresponding to the super-stringer (for use in the linear IFEM) and a local model 618 corresponding to a portion of the super-stringer (for use in the non-linear LFEM).

With reference to FIG. 6A, the global model 600 corresponds substantially to the complete span wise length of the wing box. The global model 600 comprises three stringers 602, six ribs 604 (only four of which are shown in FIG. 6A) and a wing cover 606. The aerodynamic loading is approximated by applying a plurality of point loads in the z-direction to a plurality of respective torque arms extending from the front and rear of each rib (although it will be appreciated that alternative loading techniques may be employed). FIG. 6A shows one example of such a torque arm 608 but it will be appreciated that a torque arm may be provided for the front and rear face of each rib in the global domain. Further, it will be appreciated that the length of each torque arm and the respectively applied load may be varied at each position, thus enabling a variety of aerodynamic load scenarios to be approximated. In order to enable a definite solution, displacements on the inner face 610 of the global domain are fixed to model the interface between the wing box and the aircraft fuselage (not shown). The global model 600 is discretized using conventional beam elements as is conventional in the art and conventional techniques, such as mesh refinement, may be employed to determine an appropriate mesh density and element size/shape on the basis of one or more model criterion. For the purposes of the global model 600, a relatively coarse mesh according to the following table has been found to provide acceptable results for the linear GFEM:

| Parameter | No. Elements |
| --- | --- |
| Between adjacent ribs | 8 |
| Between adjacent stringers | 2 |
| Height of wing box | 4 |

Figure 7:
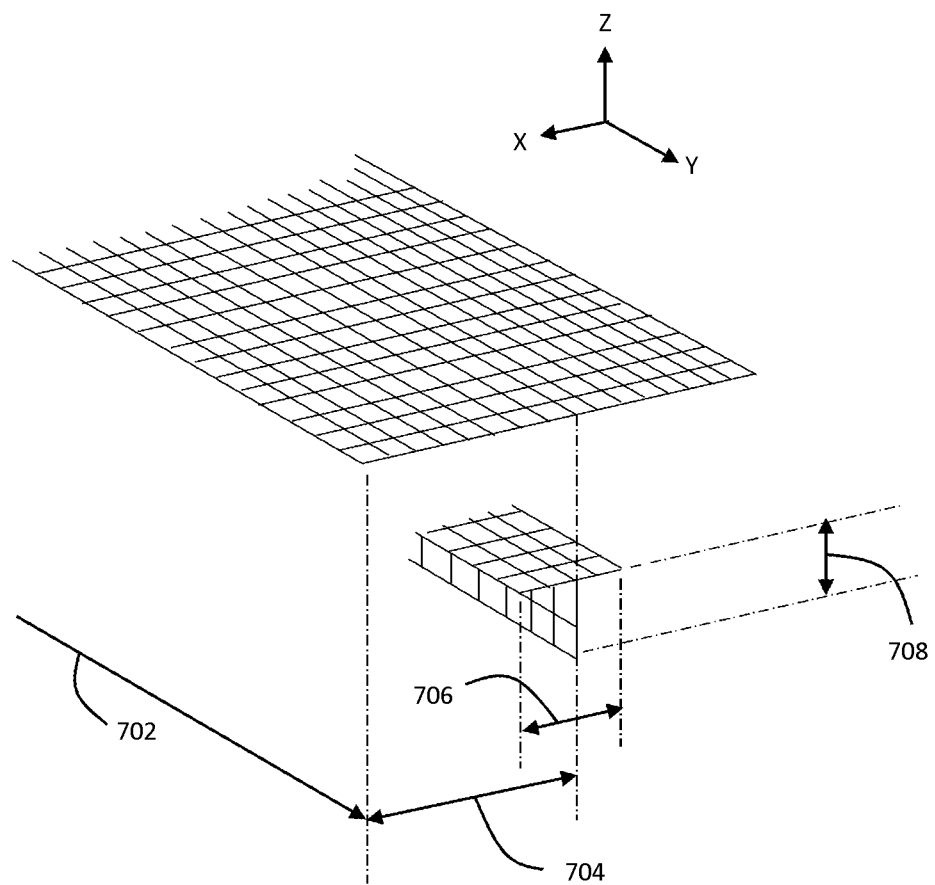
FIG. 7 is a schematic diagram of an intermediate mesh in accordance with an embodiment.

With reference to FIG. 6B, the intermediate model 612 corresponds substantially to a super-stringer covering the span-wise length of the idealized wing box of the global model 600 and covering two inter-stringer bays. The two adjacent stringers are not included in the intermediate domain so that the loads extracted from the linear GFEM of the global model are those carried by the wing cover 606 only. These loads are the only component applied to the span-wise edges of the sectioned wing cover 606. Typically, the intermediate domain 612 is discretized using shell elements for both the stringer 602 and the wing cover 606 using a more refined mesh than that of the global model 600. Connections between the stringer 602 and the wing cover 606 are modeled using 1D rivet or mesh gluing elements to approximate rivet lines or other wing cover-stringer bonding techniques. A relatively fine mesh for the intermediate model according to the following table has been found to provide acceptable results for the linear IFEM (with reference to FIG. 7).

| Parameter | No. Elements |
| --- | --- |
| Between adjacent ribs (wing cover) 702 | 32 |
| Between adjacent stringers (wing cover) 704 | 8 |
| Stringer flange 706 | 4 |
| Stringer web 708 | 2 |

The intermediate model 612 is subjected only to in-plane nodal forces in the X and Y directions, which are extracted from the linear GFEM analysis and applied to the intermediate model at corresponding nodal positions. Typically, two zones in the intermediate model are loaded: the contour of the wing cover 606 in the span-wise direction 614 and the connections 616 between the ribs 604 and the wing cover 606. The points in the intermediate model where the GFEM forces are applied are simply supported in the Z direction and additional fixations are defined in the plane of the wing cover 606 in order to obtain a fully determined system. Nodes of the wing cover which intersect a rib are not linked to the stringer in order to avoid spurious numerical interferences between the elements used to model the wing cover-stringer bonding and the boundary conditions mapped from the linear GFEM.

With reference to FIG. 6C, the local model 618 corresponds substantially to a super-stringer model covering the span-wise length of the idealized wing box of the global domain 600, and covering to the mid-point of the two adjacent inter-stringer bays (i.e. half the width of the intermediate model 612). The local mesh is obtained by discretising the local domain using shell elements for both the stringer 602 and the wing cover 606 which are again linked using mesh gluing elements as for the intermediate model. Typically, the local model 618 is discretised using the same mesh parameters as used for the intermediate model 612 and, conveniently in some embodiments, the local mesh may be obtained from the intermediate mesh by merely suppressing the elements located in the outer half of the adjacent inter-stringer bays.

The local model 618 is subject to loads which are extracted from the results of the linear IFEM and applied to the local model 618 at corresponding nodal positions. Typically, two zones in the local model 618 are loaded: the contour of the wing cover 606 in the span-wise direction and the connections between the ribs 604 and the wing cover 606. Significantly, these loads are applied as following loads directly on the corresponding nodes of the local model to enable the subsequent non-linear FEM analysis. In this context, a following loads means that the direction of the load follows the rotation of the node on which it is applied during the subsequent non-linear LFEM analysis.

In addition to the nodal forces in the X and Y directions, nodal displacements are also prescribed on the nodes in the wing cover 606 which are connected to the ribs 604. The nodal displacements are linearly extrapolated from the corresponding nodal displacements obtained from the linear GFEM analysis.

As discussed above, the local model includes an out-of-plane pressure load which is applied to the inner face of the wing cover 606 as a plurality of perpendicular nodal forces.

One main difficulty associated with the local model 618 is prescription of appropriate boundary conditions on the face the super-stringer representing the interface between the wing box and the aircraft fuselage. However, satisfactory results have been achieved by prescribing the nodal rotations around the X-axis in addition to the nodal displacements in the Z-direction on the basis of the post-processed results extrapolated from the linear GFEM analysis. Moreover, the correct application of the boundary condition to the stringer is ensured using a planarity condition between the middle node of the skin and the base of the stringer.

Figure 8A:
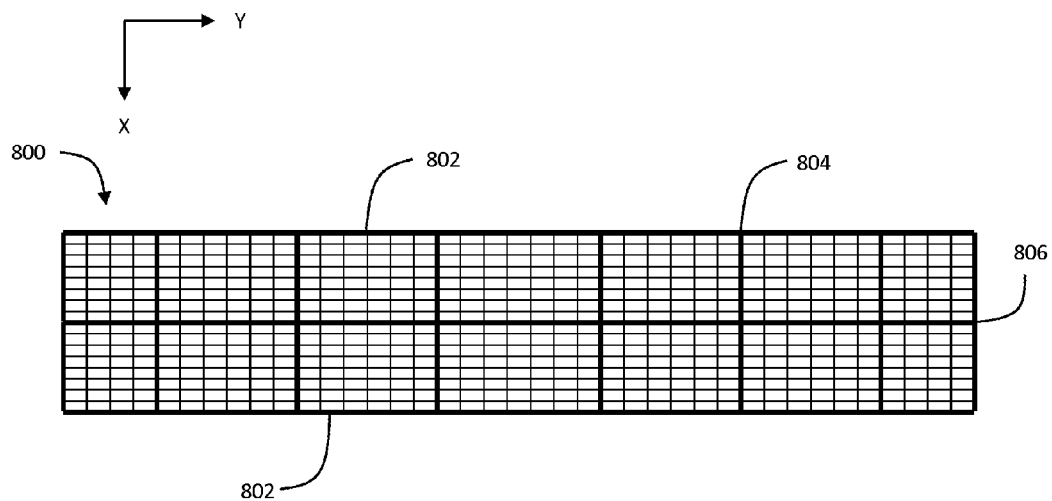
FIGS. 8A and 8B are schematic diagrams showing the boundary conditions applied to an intermediate mesh and a local mesh respectively in accordance of an embodiment.
Figure 8B:
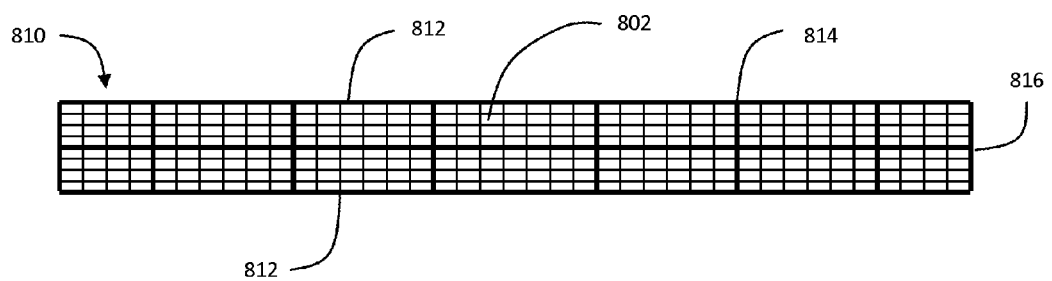

The boundary conditions applied to the intermediate and local models are shown in more details in FIGS. 8A and 8B respectively. With reference to FIG. 8A, the boundary conditions applied to the intermediate mesh 800 include in-plane nodal forces in the X and Y directions which are extracted from the linear GFEM analysis and applied to the intermediate mesh at GFEM nodes positions along edges 802. Similarly, nodes in the intermediate mesh 800 which correspond to a rib connection 804 are loaded in the X and Y directions on the basis of the post-processed GFEM analysis. Finally, although not strictly a boundary condition, the position of the stringer is indicated by line 806.

With reference to FIG. 8B, the boundary conditions applied to the local mesh 810 include the following loads which are extracted from the linear GFEM analysis and applied to the local mesh 810 at node positions along edges 812. Similarly, nodes in the intermediate mesh 810 which correspond to a rib connection 814 are loaded with following loads on the basis of the post-processed IFEM analysis. Finally, although not strictly a boundary condition, the position of the stringer is indicated by line 816.

Figure 9A:
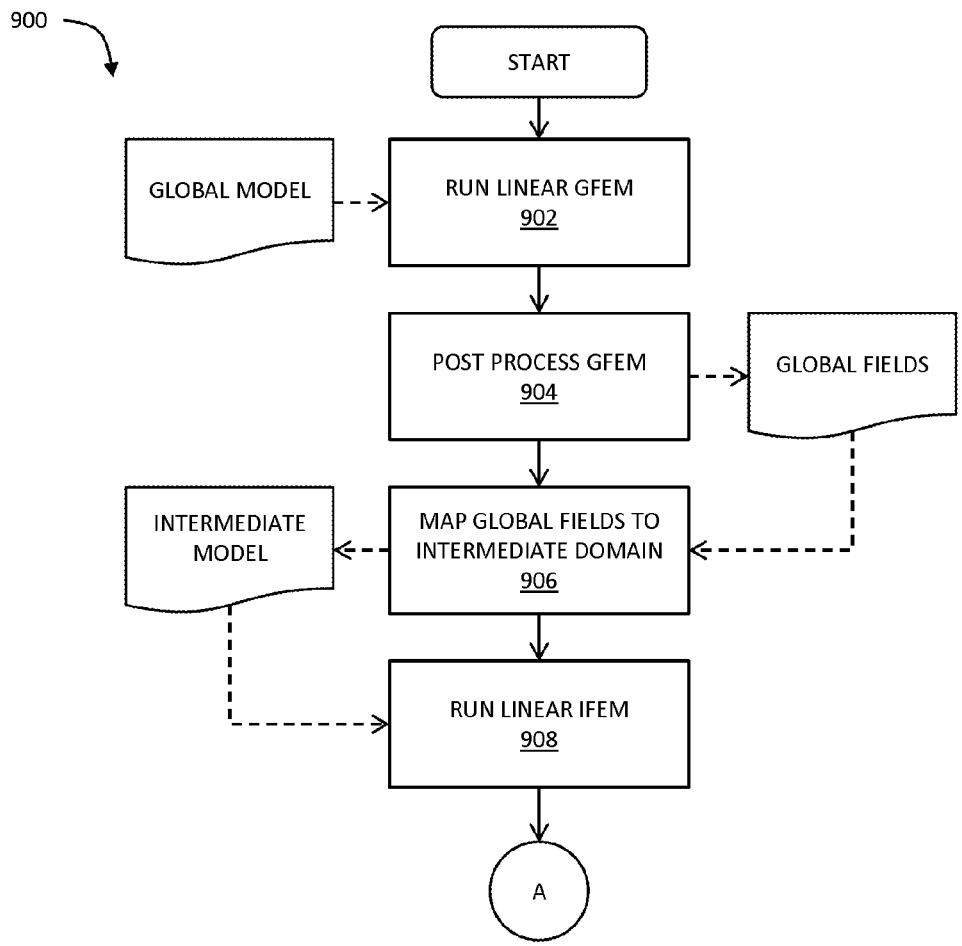
FIGS. 9A and 9B are flow diagrams showing a method of modeling the non-linear structural response of a component in accordance with an embodiment.
Figure 9B:
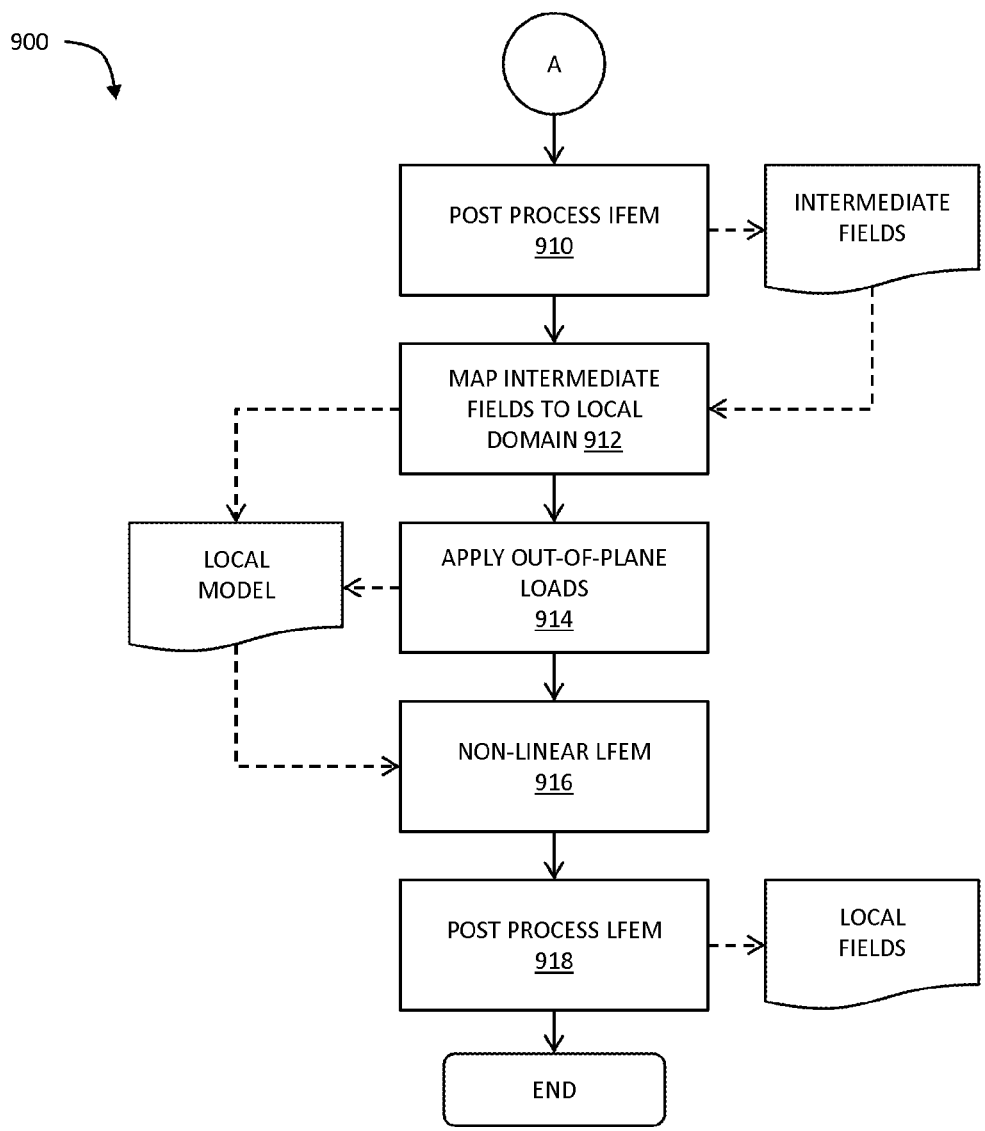

Application of the two-step local method to the global model 600, intermediate model 612 and local model 618 models is now described with reference to the method 900 shown in FIGS. 9A and 9B. First, a linear FEM analysis is performed on the basis of the global model 600 of the wing box (linear GFEM) [step 902]. Next, the results of the linear GFEM are post-processed to obtain one or more global vector fields in respect of the global mesh [step 904]. Typically, these fields include nodal displacement and nodal force. Once the global fields have been obtained, the boundary conditions for the intermediate model 612 are determined and mapped to the intermediate mesh as previously discussed [step 906]. Next, a linear FEM analysis is performed on the intermediate model (linear IFEM) [step 908] and the results of the analysis are post-processed to obtain one or more intermediate vector fields in respect of the intermediate mesh [step 910]. These fields typically include nodal displacement and nodal force. Once the intermediate fields have been obtained, the boundary conditions for the local model 618 are determined and mapped to the local mesh as discussed above [step 912]. At this stage one or more out-of-plane effects are applied to the local mesh as a nodal forces and/or nodal displacements) to produce an updated local model [step 914]. Next, a non-linear FEM analysis of the updated local model is performed (non-linear LFEM) [step 916] and the results of the non-linear LFEM are post processed to obtain one or more local vector fields which account for the out-of-plane forces [step 918].

In addition to avoiding the introduction of spurious out-of-plane stiffness in the non-linear LFEM, embodiments of the two-step local method allows the GFEM to present an odd number of elements in the wing cover spanning two adjacent stringers. In other words, embodiments of the invention enable the local mesh to be defined independently of the global mesh by virtue of the intermediate mesh, thereby enabling local boundary conditions to be defined at positions which may not correspond to a nodal position in the global mesh. Moreover, provision of the intermediate model in the two-step local approach minimises the transferral of spurious boundary effects from the linear GFEM to the non-linear LFEM which would normally be present in prior art global-local methods.

Figure 10:
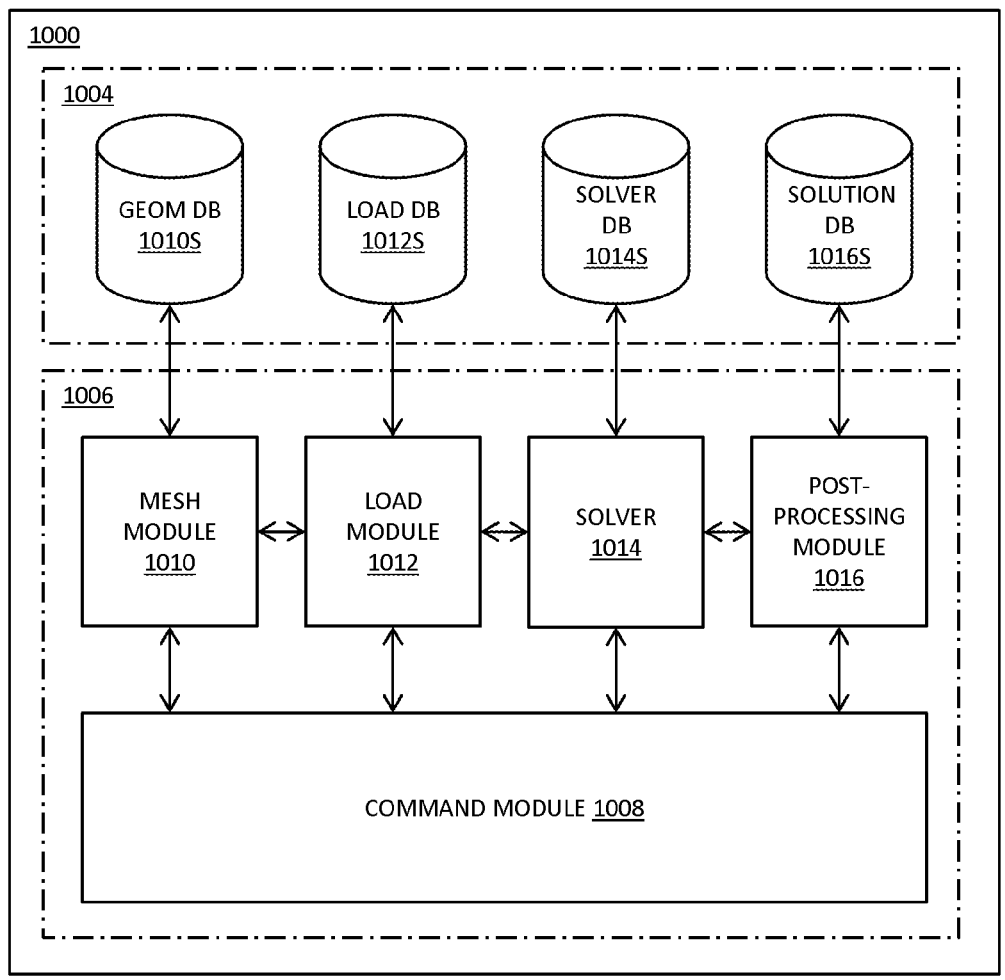
FIG. 10 is a functional drawing of a system for modeling the non-linear structural response of a component in accordance with an embodiment.

FIG. 10 shows the functional components of a system 1000 for performing a two-step local analysis of a structure in accordance with an embodiment. The system 1000 includes a command module 1002 which instructs and coordinates a plurality of further modules, including a mesh module 1010, a load module 1012, a solver module 1014 and a post processing module 1016. Each of the further modules is associated with data storage including geometry database 1010S, load database 1012S, solver database 1014S and solution database 1016S. Typically, the functionality provided each of the modules is implemented in a suitable software language, such as C++, Java or FORTRAN.

The mesh module 1010 is configured to generate meshes on the basis of data stored in a geometry database 1010S. Typically, the geometry database 1010S will include one or more parameter sets or one or more mesh files which define the model geometry and associated discretisation scheme. Alternatively, the geometry database may store a plurality of mesh files which are pre-generated using a commercial software package such as SAMCEF™ as provided by LMS SAMTECH of Leuven, Belgium, or MSC Patran™ as provided by the MSC Software Corporation of Santa Ana, Calif., USA.

Once a mesh have been generated or loaded by the mesh module 1010, it is provided to the load module 1012 for application of appropriate boundary conditions to produce a complete model for FEM analysis. The boundary conditions are stored as data in load database 1012S, which may include one or more post-processed fields from previous linear GFEM or linear IFEM analyses.

Once the boundary conditions have been applied by the load module 1012 the complete model is sent to the solver module 1014 which performs the FEM analysis on the basis of one or more solution parameters stored in the solver database 1014S. Typically, the load module 1012 utilises an iterative solution method such as a Newton-Raphson method or similar.

Finally, once the FEM analysis has been completed, the results are sent to the post-processing module 1016 which determines one or more fields which are subsequently stored in the solution database 1016S.

Figure 11:
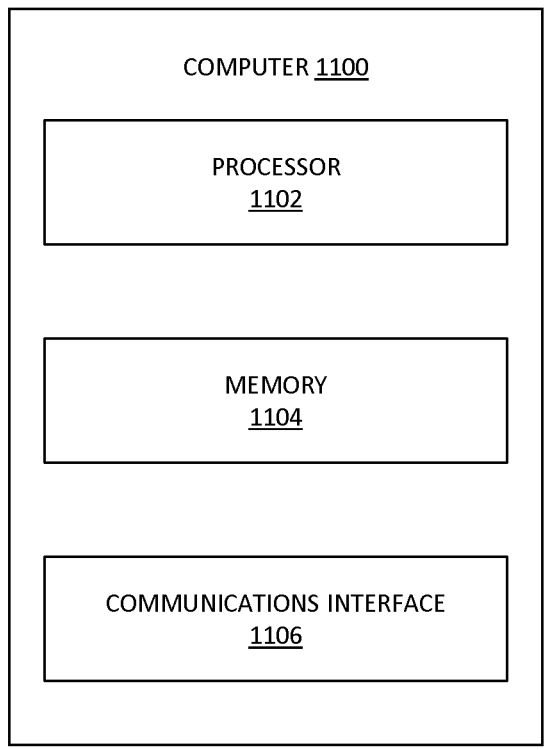
FIG. 11 is a schematic drawing of a system for modeling the non-linear structural response of a component in accordance with an embodiment.

The functionality of at least some of the embodiments depicted in FIGS. 1 to 10 is performed by a computer that executes computer readable instructions. FIG. 11 depicts a computer 1100 that includes a processor 1102, memory 1104, and a communications interface 1106. The processor 1102 may include a multifunction processor and/or an application-specific processor. Examples of processors include the PowerPC™ family of processors by IBM™ and the x86 family of processors by Intel™. The memory 1104 within the computer may include, for example, storage medium such as read only memory (ROM), flash memory, RAM, and a large capacity permanent storage device such as a hard disk drive or solid state drive. The communications interface 1106 enables communications with other computers in network 1106 using, for example, Internet Protocol (IP). The computer executes computer readable instructions stored in the storage medium to implement various tasks as described above.

Although the steps in the methods described hereinbefore are shown and described in a particular order, the order of the operations of each method may be altered so that certain operations may be performed in a different order or so that certain operations may be performed, at least in part, concurrently with other operations.

It should also be noted that at least some of the operations for the methods may be implemented using software instructions stored on a computer usable storage medium for execution by a computer. As an example, an embodiment of a computer program product includes a computer usable storage medium to store a computer readable program that, when executed on a computer, causes the computer to perform operations and methods, as described hereinbefore.

Furthermore, embodiments of the invention can be embodied in the form of a computer program product accessible from a computer-usable or computer-readable medium providing program code for use by or in connection with a computer or any instruction execution system. For the purposes of this description, a computer-usable or computer readable medium can be any apparatus that can contain, store, communicate, propagate, or transport the program for use by or in connection with the instruction execution system, apparatus, or device.

The computer-usable or computer-readable medium can be an electronic, magnetic, optical, electromagnetic, infrared, or semiconductor system (or apparatus or device), or a propagation medium. Examples of a computer-readable medium include a semiconductor or solid state memory, magnetic tape, a removable computer diskette, a random access memory (RAM), a read-only memory (ROM), a rigid magnetic disk, and an optical disk. Current examples of optical disks include a compact disk with read only memory (CD-ROM), a compact disk with read/write (CD-R/W), and a digital versatile disk (DVD).

The above embodiments are to be understood as illustrative examples of the invention. Further embodiments of the invention are envisaged. For example, although the above embodiments have been described in relation to an aircraft wing, it will be appreciated that further embodiments may be relate to any other structure or component for which a local non-linear structural analysis is desired. Moreover, it will be appreciated that further embodiments of the two-step local method may be applied to parameterised models of the structure or component under analysis to enable rapid FEM modeling of a large number of configurations and geometries using automated methods. This parameterised approach is particularly advantageous as part of the design process, and particularly in relation to component sizing.

It is to be understood that any feature described in relation to any one embodiment may be used alone, or in combination with other features described, and may also be used in combination with one or more features of any other of the embodiments, or any combination of any other of the embodiments. Furthermore, equivalents and modifications not described above may also be employed without departing from the scope of the invention, which is defined in the accompanying claims.

The invention claimed is:

1. A computer-implemented method of modelling the non-linear structural response of a stiffened panel, the method comprising:
    determining one or more intermediate boundary conditions for application to an intermediate mesh by extracting in-plane nodal forces from a linear finite element analysis of a global mesh subject to one or more global boundary conditions, wherein the one or more global boundary conditions are determined based on an out-of-plane load;
    performing a linear finite element analysis of the intermediate mesh subject to the one or more intermediate boundary conditions;
    determining one or more local boundary conditions for application to a local mesh, the one or more local boundary conditions being determined on the basis of the linear finite element analysis of the intermediate mesh and the out-of-plane load; and
    performing a non-linear finite element analysis of the local mesh subject to the one or more local boundary conditions;
    wherein the global mesh is associated with a global domain representing a real-world structure comprising the stiffened panel, the intermediate mesh is associated with an intermediate domain which is a sub-domain of the global domain, and the local mesh is associated with a local domain which is a sub-domain of the intermediate domain.

2. The computer-implemented method of claim 1, wherein the out-of-plane load comprises an out-of-plane pressure load applied to one or more nodes in the local mesh corresponding to a surface of the stiffened panel.

3. The computer-implemented method of claim 1, wherein the one or more local boundary conditions comprise an imposed displacement to one or more nodes at the boundary of the local mesh.

4. The computer-implemented method of claim 1, wherein the global domain represents an aircraft wing box comprising the stiffened panel.

5. The computer-implemented method of claim 1, wherein the one or more intermediate boundary conditions are applied to one or more nodes at the boundary of the intermediate mesh as nodal reaction forces derived from one or more free body loads obtained from the linear finite element analysis of the global mesh.

6. The computer-implemented method of claim 1, wherein the mesh density of the global mesh is relatively coarse and the mesh density of the intermediate mesh is relatively fine.

7. The computer-implemented method of claim 1, wherein the mesh density of the local mesh is equal to the mesh density of the intermediate mesh.

8. The computer-implemented method of claim 1, wherein the one or more intermediate boundary conditions are determined using a mesh sewing technique to map displacements obtained from linear finite element analysis of the global mesh to the intermediate mesh.

9. The computer-implemented method of claim 8, wherein the mesh sewing technique assumes a linear displacement field between adjacent nodes in the global mesh.

10. The computer-implemented method of claim 1, wherein the local mesh is derived from the intermediate mesh by suppressing one or more elements in the intermediate mesh.

11. A system for modelling the non-linear structural response of a stiffened panel, the system comprising a processor arranged to:
    determine one or more intermediate boundary conditions for application to an intermediate mesh by extracting in-plane nodal forces from a linear finite element analysis of a global mesh subject to one or more global boundary conditions, wherein the one or more global boundary conditions being determined on the basis of an out-of-plane load;
    perform a linear finite element analysis of the intermediate mesh subject to the one or more intermediate boundary conditions;
    determine one or more local boundary conditions for application to a local mesh, the local boundary conditions being determined on the basis of the linear finite element analysis of the intermediate mesh and the out-of-plane load; and
    perform a non-linear finite element analysis of the local mesh subject to the one or more local boundary conditions;

wherein the global mesh is associated with a global domain representing a real-world structure comprising the stiffened panel, the intermediate mesh is associated with an intermediate domain which is a sub-domain of the global domain, and the local mesh is associated with a local domain which is a sub-domain of the intermediate domain.

12. A computer program product comprising a non-transitory computer-readable storage medium having computer readable instructions stored thereon, the computer readable instructions being executable by a computerized device to cause the computerized device to perform a method of modelling the non-linear structural response of a stiffened panel, the method comprising:

determining one or more intermediate boundary conditions for application to an intermediate mesh by extracting in-plane nodal forces from a linear finite element analysis of a global mesh subject to one or more global boundary conditions, wherein the global boundary conditions being determined on the basis on an out-of-plane load;

performing a linear finite element analysis of the intermediate mesh subject to the one or more intermediate boundary conditions;

determining one or more local boundary conditions for application to a local mesh, the local boundary conditions being determined on the basis of the linear finite element analysis of the intermediate mesh and the out-of-plane load; and performing a non-linear finite element analysis of the local mesh subject to the one or more local boundary conditions;

wherein the global mesh is associated with a global domain representing a real-world structure comprising the stiffened panel, the intermediate mesh is associated with an intermediate domain which is a sub-domain of the global domain, and the local mesh is associated with a local domain which is a sub-domain of the intermediate domain.

* * * * *